(12) United States Patent
Ye

(10) Patent No.: US 12,394,743 B2
(45) Date of Patent: Aug. 19, 2025

(54) DIE ATTACHMENT STRUCTURE AND METHOD FOR MANUFACTURING THE SAME

(71) Applicant: Silergy Semiconductor Technology (Hangzhou) LTD, Zhejiang (CN)

(72) Inventor: Jiaming Ye, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 492 days.

(21) Appl. No.: 17/335,195

(22) Filed: Jun. 1, 2021

(65) Prior Publication Data

US 2021/0384155 A1    Dec. 9, 2021

(30) Foreign Application Priority Data

Jun. 5, 2020  (CN) .......................... 202010503945.0

(51) Int. Cl.
*H01L 23/00*         (2006.01)

(52) U.S. Cl.
CPC .............. *H01L 24/30* (2013.01); *H01L 24/83* (2013.01); *H01L 2224/30051* (2013.01); *H01L 2224/8385* (2013.01)

(58) Field of Classification Search
CPC ............ H01L 2224/80; H01L 2224/83; H01L 2224/8319; H01L 2224/83192; H01L 2224/83193; H01L 2224/8389; H01L 2224/8385–83885; H01L 2224/8185–8189; H01L 2224/2969–29691; H01L 2224/2919–29191; H01L 2224/1369–13691; H01L 2224/271; H01L 2224/2711; H01L 2224/2712; H01L 2224/273; H01L 2224/27331; H01L 2224/27312; H01L 23/12; H01L 23/13; H01L 21/56; H01L 23/36; H01L 23/3171; H01L 23/3185; H01L 23/3192; H01L 23/3735; H01L 2224/30051; H01L 2224/2731; H01L 2224/27416; H01L 2224/27436; H01L 2224/27515; H01L 2224/32053; H01L 2224/32105; H01L 2224/32106; H01L 2224/32237; H01L 2224/32257; H01L 2224/83856; H01L 24/30; H01L 24/83; H01L 24/27; H01L 24/29; H01L 24/32

See application file for complete search history.

(56) References Cited

U.S. PATENT DOCUMENTS

| | | |
|---|---|---|
| 8,581,518 B2 | 11/2013 | Kuang et al. |
| 2007/0221318 A1* | 9/2007 | Reiss ...................... H01L 24/27 |
| | | 156/764 |
| 2011/0127925 A1 | 6/2011 | Huang et al. |
| 2015/0255312 A1* | 9/2015 | Brofman ........... H01L 23/49838 |
| | | 257/737 |
| 2017/0318639 A1 | 11/2017 | Wang et al. |
| 2018/0218941 A1* | 8/2018 | Arai .................... H01L 23/5226 |

(Continued)

*Primary Examiner* — Julio J Maldonado
*Assistant Examiner* — Stanetta D Isaac

(57) ABSTRACT

A die attachment structure can include: a base; a die located above a first surface of the base; a first adhesive layer located on a back surface of the die, wherein the die is pasted on the first surface of the base at least by the first adhesive layer; and a second adhesive layer at least partially covering the sidewalls of the die.

17 Claims, 3 Drawing Sheets

(56) References Cited

U.S. PATENT DOCUMENTS

| | | | |
|---|---|---|---|
| 2018/0242455 A1* | 8/2018 | Kuhlman | ................ H01L 25/16 |
| 2018/0295685 A1 | 10/2018 | Wang et al. | |
| 2018/0295690 A1 | 10/2018 | Chen et al. | |
| 2018/0310376 A1 | 10/2018 | Huang et al. | |
| 2019/0123250 A1* | 4/2019 | Li | ........................... H01L 33/62 |

* cited by examiner

DIE ATTACHMENT STRUCTURE AND METHOD FOR MANUFACTURING THE SAME

RELATED APPLICATIONS

This application claims the benefit of Chinese Patent Application No. 202010503945.0, filed on Jun. 5, 2020, which is incorporated herein by reference in its entirety.

FIELD OF THE INVENTION

The present invention generally relates to the field of die packages, and more particularly to die attachment structures and associated manufacturing methods.

BACKGROUND

With the rapid improvement of package integration, more than two silicon dice can be integrated within the same package. In addition, because of different wafer process requirements, different dice in the same package may have different substrate voltages, and some dice may need to be insulated and isolated within the package.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Currently, the processes of the non-conductive adhesive used for isolation include an adhesive-brushing process, an attaching die attach film (DAF) film process, and an adhesive-dispensing process. The adhesive-brushing process and the DAF film can well control the thickness of the adhesive layer, and voids therein are not easily produced. The insulation reliability of the adhesive-brushing process and the DAF film are typically better than that of the adhesive-dispensing process, but the thermal conductivity of the two materials is relatively low (e.g., <1 W/mK), and thus is not conducive to the overall heat dissipation design of the package.

The adhesive-dispensing process can use a non-conductive adhesive having high thermal conductivity (e.g., >2 W/mK) to improve the heat dissipation, but the adhesive-dispensing process has difficulty controlling the thickness of the adhesive, and voids therein may be produced. This can affect the insulation ability of the adhesive layer, especially in high-voltage products (e.g., >100V), with a potential risk of high voltage breakdown failure. Accordingly, current approaches may not have good compatibility while meeting isolation and heat dissipation requirements.

In particular embodiments, a die attachment structure can include a base, a die located on a first surface of the base, a first adhesive layer located on a back surface of the die, and a second adhesive layer at least covering the sidewalls of the die. For example, the die is attached to the first surface of the base at least by the first adhesive layer. Also, the first adhesive layer and the second adhesive layer may be formed by different processes.

Figure 1:
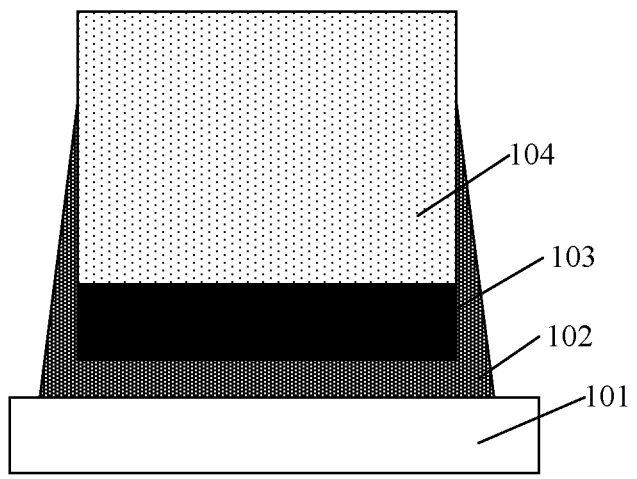
FIG. 1 is a sectional view of a first example die attachment structure, in accordance with embodiments of the present invention.

Referring now to FIG. 1, shown is a sectional view of a first example die attachment structure, in accordance with embodiments of the present invention. The die attachment structure can include base 101, adhesive layer 103 (black structure in FIG. 1), adhesive layer 102, and die 104. For example, die 104 can be located above a first surface of base 101, adhesive layer 103 can be located on a back surface of die 104, and adhesive layer 102 may at least partially cover the sidewalls of die 104. Die 104 can be pasted on the first surface of base 101 by adhesive layer 103. For example, the first surface of base 101 can be flat, and adhesive layer 102 can include a first part located on the first surface of base 101 and a second part that "crawls" on the sidewalls of die 104. That is, die 104 can be pasted on the first surface of base 101 by adhesive layer 103 and the first part of adhesive layer 102. Further, adhesive layer 102 can cover part of the sidewalls of die 104, and may cover adhesive layer 103 on the back surface of die 104.

It should be noted that adhesive layer 102 may not crawl to an upper surface (e.g., active surface) of the die, and the upper surface of the die is opposite to the back surface of the die. Further, the height of the second part of the second adhesive layer that crawls on the sidewalls of the die may not be more than, e.g., about 90% of the thickness of the die. Further, the direction of adhesive layer 102 crawling on the sidewalls of the die may extend from the back surface of the die toward the upper surface of the die.

In this example, adhesive layers 102 and 103 may both be non-conductive adhesive layer, but these adhesive layers can be different. For example, adhesive layer 102 may be formed by an adhesive-dispensing process, and adhesive layer 102 may have a high thermal conductivity. For example, the thermal conductivity of adhesive layer 102 may not be less than, e.g., about 2 W/mK. Adhesive layer 103 can be formed by an adhesive-brushing process or by sticking a DAF film on the back surface of the die, such that adhesive layer 103 may have a uniform thickness that does not easily produce voids. In addition, the first surface of the base further can include pads; that is, die 104 can be pasted on the pads on the first surface of the base.

In particular embodiments, a method of manufacturing a die attachment structure can include providing a die and a base, forming a first adhesive layer on the back surface of the die, forming a second adhesive layer at least partially covering the sidewalls of the die, and pasting the die on the first surface of the base at least by the first adhesive layer.

For example, adhesive layer 103 may be formed on a back surface of die 104, and adhesive layer 103 may be formed by an adhesive-brushing process, or by sticking a DAF film on the back surface of the die. Adhesive layer 103 formed by such processes can more easily control the thickness of adhesive layer 103 to have a uniform thickness, and not easily produce voids, which can ensure the insulation and isolation of the die. The first adhesive layer can be non-conductive adhesive, such as 8006 adhesive.

For example, the adhesive-brushing process can include the adhesive being evenly attached to the back surface of the die by a scraper coating or a high-speed spin coating, and pre-curing the adhesive to ensure the connection between the adhesive and the back surface of the die. Generally, the die can be thinned to a specified thickness before adhesive layer 103 is formed on the back surface of the die.

Adhesive layer 102 can be formed on a first surface of base 101. For example, an adhesive-dispensing process can be used to form adhesive layer 102 on the first surface of base 101. The adhesive-dispensing process can include application of the adhesive material in a needle tube by pressure or other transfer methods to the designated position on the first surface of the base to form adhesive layer 102, and adhesive layer 102 may not be cured. For example, adhesive layer 102 is non-conductive adhesive layer (e.g., 8472 adhesive, 8488 adhesive, etc.) Adhesive layer 102 may have a high thermal conductivity, e.g., the thermal conductivity of adhesive layer 102 may not be less than 2 W/mK. In this example, the first surface of the base can also include pads, and adhesive layer 102 may be located on the pads of the base. It should also be noted that the order of the above steps is not restricted, and the order can be reversed, or the two steps may be performed at substantially the same time.

The method can also include pasting die 104 on the first surface of base 101 with the back surface facing the first surface of base 101. For example, when die 104 is pasted on the first surface of base 101, a certain pressure may be applied to make part of adhesive layer 102 effectively crawl up the sidewalls of die 104. For example, the height of adhesive layer 102 crawling on the sidewalls of the die may not be more than 90% of the thickness of the die, and the direction of adhesive layer 102 crawling on the sidewalls of the die may extend from the back surface of the die to an upper surface of the die, whereby the upper surface of the die is opposite to the back surface of the die. In this example, the thickness of the die can be appropriately increased to facilitate control of the height of adhesive layer 102 formed by the adhesive-dispensing process on the sidewalls of the die. Also, the contact area between the sidewalls of the die and adhesive layer 102 can be increased, in order to improve heat dissipation capacity.

Figure 2:
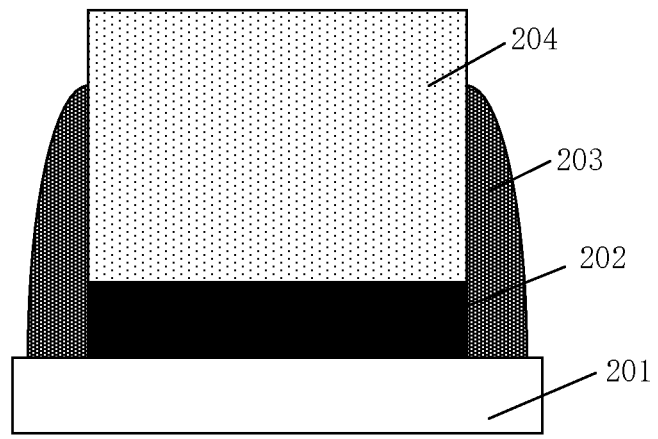
FIG. 2 is a sectional view of a second example die attachment structure, in accordance with embodiments of the present invention.

Referring now to FIG. 2, shown is a sectional view of a second example die attachment structure, in accordance with embodiments of the present invention. In this particular example, the die attachment structure can include base 201, adhesive layer 202, adhesive layer 203, and die 204. For example, the first surface of the base can be flat, a back surface of die 204 may be pasted on the first surface of base 201 by adhesive layer 202, and adhesive layer 203 can cover the side surfaces of adhesive layer 202, and at least partially the sidewalls of die 204. For example, the height of adhesive layer 203 crawling on the sidewalls of the die may not be greater than 90% of the thickness of the die, and the direction of adhesive layer 203 crawling on the sidewalls of the die may extend from the back surface of the die to the upper surface of the die, whereby the upper surface of the die is opposite to the back surface of the die. Adhesive layer 203 may also have a relatively high thermal conductivity (e.g., not less than about 2 W/mK). Adhesive layer 202 may have a uniform thickness without voids. In this example, adhesive layer 203 may be formed by an adhesive-dispensing process, and adhesive layer 202 may be formed by adhesive-brushing process or by sticking a DAF film on the back surface of the die. The first surface of base 201 can also include pads; that is, die 204 is pasted on the pads on the first surface of the base.

In particular embodiments, a method of manufacturing the die attachment structure shown in FIG. 2 can include forming adhesive layer 202 on a back surface of die 204. For example, adhesive layer 202 can be formed by an adhesive-brushing process, or by sticking a DAF film on the back surface of die 204. Adhesive layer 202 formed by these two processes can be easier to control the thickness of the adhesive layer without easily producing voids, and may ensure the insulation and isolation of the die. Adhesive layer 202 can be a non-conductive adhesive.

The method can also include pasting die 204 on the first surface of the base by adhesive layer 202 with the back surface of the die facing the first surface of base 201, and using an adhesive-dispensing process to form adhesive layer 203 covering the sidewalls of die 204. For example, the adhesive-dispensing process may apply the adhesive material in a needle tube by pressure or other transfer methods to sidewalls of the die to form adhesive layer 203. Adhesive layer 203 can cover the side surface of adhesive layer 202 (shown in black in FIG. 2). For example, adhesive layer 203 may be non-conductive adhesive layer, and can have a relatively high thermal conductivity (e.g., not less than about 2 W/mK).

For example, the height of adhesive layer 203 crawling on the sidewalls of the die may not be more than 90% of the thickness of the die. In this example, the thickness of the die can be appropriately increased to facilitate control of the height of adhesive layer 203 formed by the adhesive-dispensing process on the sidewalls of the die, and the contact area between the sidewalls of the die and adhesive layer 203 can also be increased to improve heat dissipation capacity.

In particular embodiments, two layers of non-conductive adhesive can be formed by different processes, such that the junction temperature generated by the die during operation can be transmitted to the base through adhesive layer 202 under the die, and to the base through adhesive layer 203 on the sidewalls of the die, thereby improving the heat dissipation capability of the package. In addition, adhesive layer 202 formed by the adhesive-brushing process and sticking DAF film process may have a uniform thickness that does not easily produce voids, and may provide good insulation and isolation for the die.

Figure 3:
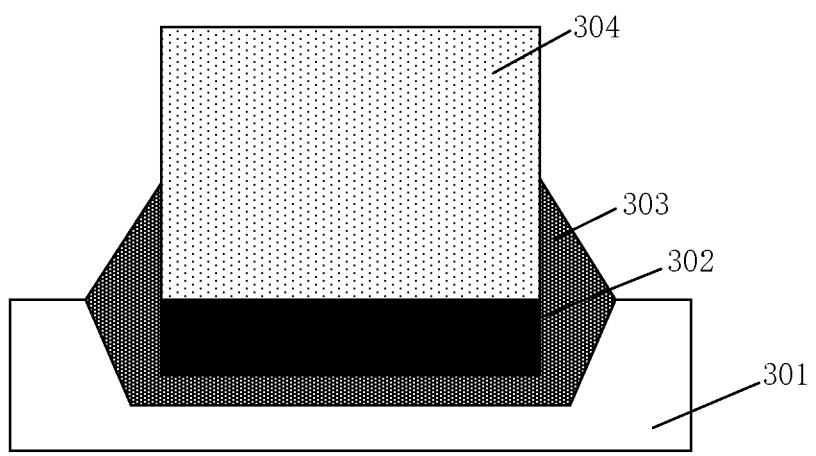
FIG. 3 is a sectional view of a third example die attachment structure, in accordance with embodiments of the present invention.

Referring now to FIG. 3, shown is a sectional view of a third example die attachment structure, in accordance with embodiments of the present invention. The die attachment structure in this particular example can include base 301, adhesive layer 302, adhesive layer 303, and die 304. Here, the first surface of base 301 can include a groove structure, and die 304 may be mounted in the groove structure. In this example, the size of the groove structure may be sufficient to accommodate the lateral width of die 304, and at least part of the thickness of die 304 can be located in the groove structure. That is, the upper surface of die 304 can be higher than a top surface of the groove structure.

Die 304 can be pasted on the bottom of the groove structure by adhesive layers 302 (shown in black in FIG. 3) and 303. Adhesive layer 303 may not only crawl up the sidewalls of the die, but can also fill the gap between the groove structure and die 304. In this example, the groove structure can be a structure with a narrow bottom and a wide top; that is, a width of a bottom part of the groove structure can be less than that of a top part of the groove structure. Of course, those skilled in the art will recognize that other suitable structures may also be supported in certain embodiments. The base structure of this example can also be applicable to the die attachment structure shown in FIG. 2. That is, die 204 can also be pasted on the bottom of the groove structure of the first surface of the base only through adhesive layer 302, and adhesive layer 303 may only cover the side surfaces of adhesive layer 302 and the sidewalls of die 304.

In particular embodiments, the manufacturing method of the die bond structure of the example of FIG. 3 can include, before forming adhesive layers 302 and 303, forming a groove structure on the first surface of base 301. For example, the groove structure can be formed by chemical etching or mechanical denting. In the die attachment structure provided in this example, by forming a groove structure on the first surface of the base and mounting the die in the groove structure, the distance between the periphery of the die and the pad can be reduced. That is, the heat dissipation path on the side of the die can be shortened, and this arrangement may further improve the heat dissipation capacity.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A die attachment structure, comprising:
    a) a base;
    b) a die located above a first surface of the base;
    c) a first adhesive layer located on and fully covering a back surface of the die, wherein the die is pasted on the first surface of the base at least by the first adhesive layer; and
    d) a second adhesive layer at least partially covering only the two sidewalls of the die,
    e) wherein the first adhesive layer and the second adhesive layer are different and are set as non-conductive adhesive layers, and wherein the first surface of the base comprises a groove structure, and the die is mounted in the groove structure, and
    f) wherein a height of the second adhesive layer crawling on the sidewalls of the die is not more than 90% of the thickness of the die, the direction of the second adhesive layer crawling on the sidewalls of the die extends from the back surface of the die to an upper surface of the die, and the upper surface of the die is opposite to the back surface of the die.

2. The die attachment structure of claim 1, wherein the first adhesive layer and the second adhesive layer are formed by different processes.

3. The die attachment structure of claim 1, wherein the second adhesive layer is also located on the first surface of the base, and the die is pasted on the first surface of the base by the first adhesive layer and the second adhesive layer.

4. The die attachment structure of claim 1, wherein the first surface of the base is flat.

5. The die attachment structure of claim 1, wherein an upper surface of the die is higher than a top of the groove structure, and the upper surface of the die is opposite to the back surface of the die.

6. The die attachment structure of claim 1, wherein a width of a bottom part of the groove structure is less than that of a top part of the groove structure.

7. The die attachment structure of claim 1, wherein the first adhesive layer is formed by an adhesive-brushing process or sticking a die attach film (DAF) on the back surface of the die.

8. The die attachment structure of claim 1, wherein the second adhesive layer is formed by an adhesive-dispensing process.

9. The die attachment structure of claim 1, wherein the groove structure is formed by etching process or mechanically denting process.

10. A die attachment structure, comprising:
    a) a base;
    b) a die located above a first surface of the base;
    c) a first adhesive layer located on a back surface of the die, wherein the die is pasted on the first surface of the base at least by the first adhesive layer; and
    d) a second adhesive layer at least partially covering the sidewalls of the die,
    e) wherein a thermal conductivity of the second adhesive layer is not less than 2 W/mK.

11. The die attachment structure of claim 10, wherein the first adhesive layer and the second adhesive layer are formed by different processes.

12. The die attachment structure of claim 10, wherein the first adhesive layer and the second adhesive layer are different.

13. The die attachment structure of claim 10, wherein the second adhesive layer is also located on the first surface of the base, and the die is pasted on the first surface of the base by the first adhesive layer and the second adhesive layer.

14. The die attachment structure of claim 10, wherein the first surface of the base is flat.

15. The die attachment structure of claim 10, wherein the first surface of the base comprises a groove structure, and the die is mounted in the groove structure.

16. The die attachment structure of claim 15, wherein an upper surface of the die is higher than a top of the groove structure, and the upper surface of the die is opposite to the back surface of the die.

17. The die attachment structure of claim 15, wherein a width of a bottom part of the groove structure is less than that of a top part of the groove structure.

* * * * *